United States Patent
Yao et al.

(10) Patent No.: US 8,611,118 B2
(45) Date of Patent: Dec. 17, 2013

(54) GATE DRIVE CONTROLLER CIRCUIT WITH ANTI-SATURATION CIRCUIT AND POWER UP CIRCUIT THEREFOR

(75) Inventors: Gang Yao, ShangHai (CN); Bo Zhang, ShangHai (CN); Ting Zhang, ShangHai (CN)

(73) Assignee: General Electric Company, Schenectady, NY (US)

( * ) Notice: Subject to any disclaimer, the term of this patent is extended or adjusted under 35 U.S.C. 154(b) by 374 days.

(21) Appl. No.: 12/893,584

(22) Filed: Sep. 29, 2010

(65) Prior Publication Data

US 2012/0002447 A1 Jan. 5, 2012

(30) Foreign Application Priority Data

Jul. 5, 2010 (CN) .......................... 2010 1 0261079

(51) Int. Cl.
*H02M 7/06* (2006.01)
*H02M 1/08* (2006.01)
*H02M 1/40* (2007.01)

(52) U.S. Cl.
USPC .............................. 363/126; 363/50; 323/282

(58) Field of Classification Search
USPC ......... 323/282; 363/15, 20, 21.04, 22, 24, 50, 363/126, 127; 327/434
See application file for complete search history.

(56) References Cited

U.S. PATENT DOCUMENTS

| | | | | |
|---|---|---|---|---|
| 4,890,217 A | * | 12/1989 | Conway | 363/143 |
| 4,937,722 A | * | 6/1990 | Deierlein | 363/49 |
| 5,023,766 A | * | 6/1991 | Laidler | 363/16 |
| 5,481,219 A | * | 1/1996 | Jacobs et al. | 327/434 |
| 5,563,536 A | * | 10/1996 | Hosl et al. | 327/108 |
| 5,786,687 A | * | 7/1998 | Faulk | 323/289 |
| 6,069,802 A | * | 5/2000 | Priegnitz | 363/21.06 |
| 6,473,284 B1 | * | 10/2002 | Ilic et al. | 361/91.1 |
| 6,807,071 B1 | | 10/2004 | Zhang et al. | |
| 7,116,090 B1 | * | 10/2006 | Yang et al. | 323/288 |
| 8,184,457 B2 | * | 5/2012 | Chen et al. | 363/53 |
| 2004/0251951 A1 | * | 12/2004 | Beck | 327/427 |
| 2007/0279028 A1 | * | 12/2007 | Lee | 323/284 |

FOREIGN PATENT DOCUMENTS

JP 60208118 A * 10/1985

OTHER PUBLICATIONS

"Transition-Mode PFC Controller", 2005 STMMicroelectronics, pp. 1-16.

* cited by examiner

*Primary Examiner* — Adolf Berhane
*Assistant Examiner* — Fred E Finch, III
(74) *Attorney, Agent, or Firm* — Fay Sharpe LLP

(57) ABSTRACT

A high side isolated gate drive controller circuit is presented with an on-time limiting circuit to prevent isolation transformer saturation as well as a universal power up circuit adaptable to power the driver with constant voltage for different input voltage levels.

25 Claims, 6 Drawing Sheets

GATE DRIVE CONTROLLER CIRCUIT WITH ANTI-SATURATION CIRCUIT AND POWER UP CIRCUIT THEREFOR

CROSS-REFERENCE TO RELATED APPLICATIONS

This application claims priority to and the benefit of Chinese patent application No. 201010261079.5, filed Jul. 5, 2010, the entirety of which is hereby incorporated by reference.

BACKGROUND OF THE DISCLOSURE

Driver control circuits are often used to actuate power switching devices, such as MOSFETs, IGBTs, etc., in switching power supplies for lighting systems and other power conversion applications, while isolating the switching control circuitry from the high voltages of the power conversion circuits. Many conventional gate drive controller circuits, however, suffer from poor performance and inability to reliably provide drive voltages sufficient to actuate the power MOSFET at high duty cycles, and certain approaches to solve this problem suffer from driver isolation transformer core saturation.

FIG. 1A shows portions of a power converter in which a buck-boost DC-DC converter circuit 300 has one or more power switches driven by isolated driver circuitry. In this system, the converter includes a buck converter stage 310 followed by a boost converter 320. The buck converter 310 receives a DC input at input terminals Vin+ and Vin−, and includes a MOSFET Q1 with a drain connected to Vin+ and a source connected to the high side input of the boost converter 320, as well as a diode D2 connected across the bock converter output lines. The boost converter 320 has a series inductor L connected to the upper input and a second MOSFET Q2 connected between the inductor L and the lower terminal, as well as a diode D3 connected from the common node of the inductor L and Q2 to an upper output Vout, with a pair of series output capacitors C2 and C3 connected between Vout and the lower terminal.

The conventional high side drive controller circuit 100a in FIG. 1A is used to drive the gate-source voltage Vgs of Q1 for operation of the buck stage 310. The controller 100a receives power (Vcc) from a power up circuit 200a and includes a transformer T1 for isolating the driver switching controls not shown) from the potentially high voltages of the buck-boost converter 300. A PWM controller 110 selectively provides a square wave to drive the transformer primary circuit including a transformer primary, a DC blocking capacitor C1, and a resistance R1 with a square wave signal. The PWM signal from the controller component 110 is coupled to the transformer primary through a resistor R1 and a series capacitor C1, and the transformer secondary provides isolated AC power to a rectifier circuit including a diode D1 and resistor Rgs to selectively provide a gate control signal (Vgs) as a voltage between gate and source terminals of the transistor Q1 in the buck converter 310. The illustrated controller 100a, however, suffers from inability to provide the necessary gate drive voltage at high PWM duty cycle levels, and thus may not be able to reliable switch the MOSFET Q1 on.

FIG. 1B shows another conventional driver circuit 100b with a DC blocking capacitor C2 added to the upper secondary circuit node to address the voltage sufficiency issues with the design of FIG. 1A for high duty cycle conditions. Although this approach is an improvement in steady state operation, if the PWM controller 110 stays on too long or shuts off, the driver circuit transformer T1 can become saturated, leading to the charge from the secondary capacitor C2 inadvertently turning on the MOSFET Q1. In particular, some PWM controllers such as the L6562 will keep the output at a high level all the time if the circuit output is lower than a setpoint voltage. If the drive circuit as shown in FIG. 1B is used to drive Q1 as shown in FIG. 1A, then after several micro seconds the gate drive transformer T1 will become saturated, Q1 will turn off and the input cannot transfer energy to the load. This, in turn, may lead to the Vcc of an L6562 controller 110 falling, with the PWM controller 110 stopping. With the PWM controller 110 off, the primary side DC blocking capacitor C1 will transfer the energy to the secondary side, resulting in Q1 being turned on, which can cause Q1 to fail. Another potential problem in the circuit 100b of FIG. 1B is if the capacitance of C1 is large and the transformer is not saturated, the DC blocking capacitor C2 of the secondary circuit may discharge slowly when controller 110 shuts off, which may lead to the FET Q1 turning on.

FIG. 1C shows a further conventional driver design 100c in which a secondary-side MOSFET Q0 has been added to the lower secondary circuit branch, with a control gate tied to the upper secondary winding. This design uses the transistor Q0 to control transformer saturation, as described in U.S. Pat. No. 6,807,071, incorporated herein by reference. However, this approach introduces an additional MOSFET component and thus increases the circuit size and cost.

As shown in FIG. 1A, the PWM controller 110 receives power (Vcc) from the power up circuit 200a. In the case of FIG. 1A, a charge-pump type power up circuit 200a with transformer T2 is used to generate Vcc, but this circuit suffers from poor output stability for load changes and/or where different AC input voltages are received from the AC input source 210.

FIG. 1D is a partial schematic diagram illustrating a full wave rectifier power up circuit 200b that can be used, but this design also fails to provide steady supply voltages Vcc to the controller 110 and other integrated circuits as input supply levels and/or output loading conditions change.

Thus, there remains a need for improved gate driver circuits and power up circuits to provide switching control circuit isolation from driven switching devices while mitigating isolation transformer core saturation.

SUMMARY OF THE DISCLOSURE

A drive controller circuit is provided for driving a control terminal of a transistor, which includes first and second driver outputs for connection to the terminals of a transistor being driven, as well as a driver transformer having primary and secondary windings wound on a core, with one end of the secondary winding coupled with a second driver output. The driver circuit also includes a pulse width modulation (PWM) driver with a control input and a PWM output, along with a first capacitor coupled between a first end of the primary winding and the PWM output, a second capacitor coupled between the first end of the secondary winding and the first driver output, and a rectifier is coupled between the first and second driver outputs. A limiting circuit is provided, which includes a limiting circuit input coupled with the PWM output, and a limiting control output coupled with the PWM controller, where the limiting control output provides a limiting control signal to the PWM controller to limit the on-time of the PWM output at or below an on-time threshold value. In certain embodiments, the on-time threshold value is set to avoid saturation of the core of the driver transformer.

The limiting circuit in certain embodiments includes a resistor coupled between the limiting circuit input and an intermediate node, a limiting circuit capacitance coupled between the intermediate node and a circuit ground, and a limiting circuit diode comprising an anode coupled with the intermediate node and a cathode coupled with the limiting control output. In various embodiments, the second resistor and the limiting circuit capacitance set a time constant of the limiting circuit which determines a rise time of a voltage of the intermediate node to rise to a voltage threshold when the PWM output is activated, and the rise time of the intermediate node voltage determines the on-time threshold value.

A power up circuit is provided for powering a PWM controller, which has an input coupleable to an AC input source, and a transformer with a primary coupled to the input to receive AC input power as well as first and second secondary windings. The first secondary winding has a first end coupled to a first power up circuit rectifier and a second end coupled to a circuit ground, and the second secondary winding a first end coupled with the circuit ground and a second end coupled to a second power up circuit rectifier. A power up circuit output is coupled with the first and second rectifiers and provides a generally constant output voltage to power a PWM controller circuit independent of a voltage of the AC input power.

In certain embodiments, the first rectifier has an anode coupled to the first end of the first secondary winding and the second rectifier has an anode coupled to the second end of the second secondary and a cathode coupled to the output. The power up circuit in these embodiments also includes a resistance between the cathode of the first rectifier and an intermediate power up circuit node, along with a zener with an anode coupled to the circuit ground and a cathode coupled to the intermediate node. The circuit further includes a transistor with a first terminal coupled to the output, a second terminal coupled to the first rectifier, and a control terminal coupled to the intermediate node, where the voltage between the control terminal and the first terminal determines the transistor impedance between the first and second transistor terminals. The transistor thus selectively connects the first rectifier with the output when the output voltage is less than the zener voltage of the zener diode and disconnects the first rectifier from the output when the output voltage is greater than the zener voltage.

The power up circuit in certain embodiments also includes an output capacitance coupled between the output and the circuit ground and a second zener diode comprising an anode coupled to the circuit ground, and a cathode coupled to the output.

BRIEF DESCRIPTION OF THE DRAWINGS

One or more exemplary embodiments are set forth in the following detailed description and the drawings, in which.

DETAILED DESCRIPTION OF THE PREFERRED EMBODIMENTS

Figures 2, 2A:
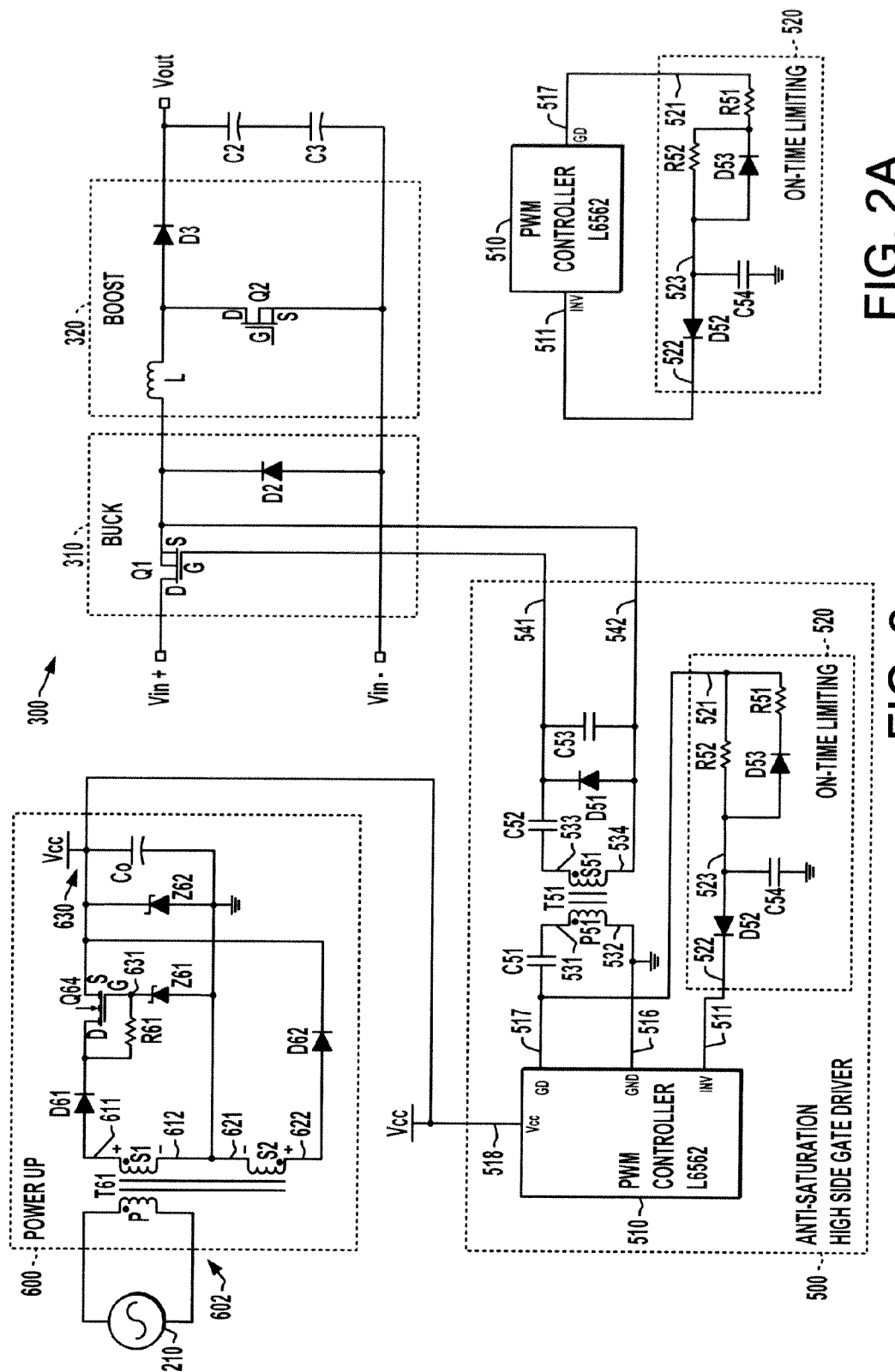
FIG. 2 is a schematic diagram illustrating portions of a power converter with an exemplary universal power up circuit and an exemplary drive controller circuit with a limiting circuit to mitigate transformer saturation.
FIG. 2A is a partial schematic diagram illustrating another exemplary limiting circuit to mitigate transformer saturation in the drive controller circuit of FIG. 2.
Figure 3:
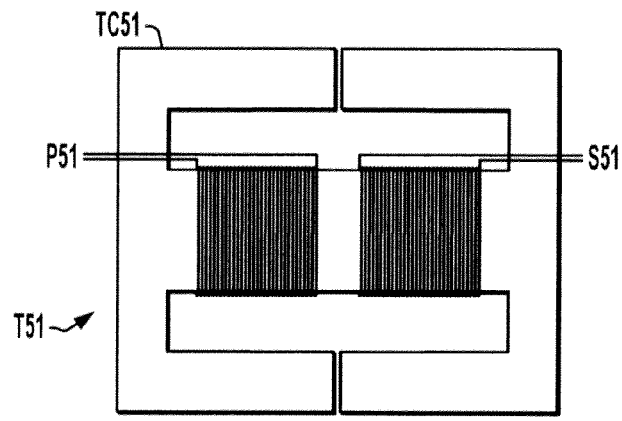
FIG. 3 is a side elevation view showing an exemplary transformer core with primary and secondary windings in the driver circuit of FIG. 2.
Figure 4:
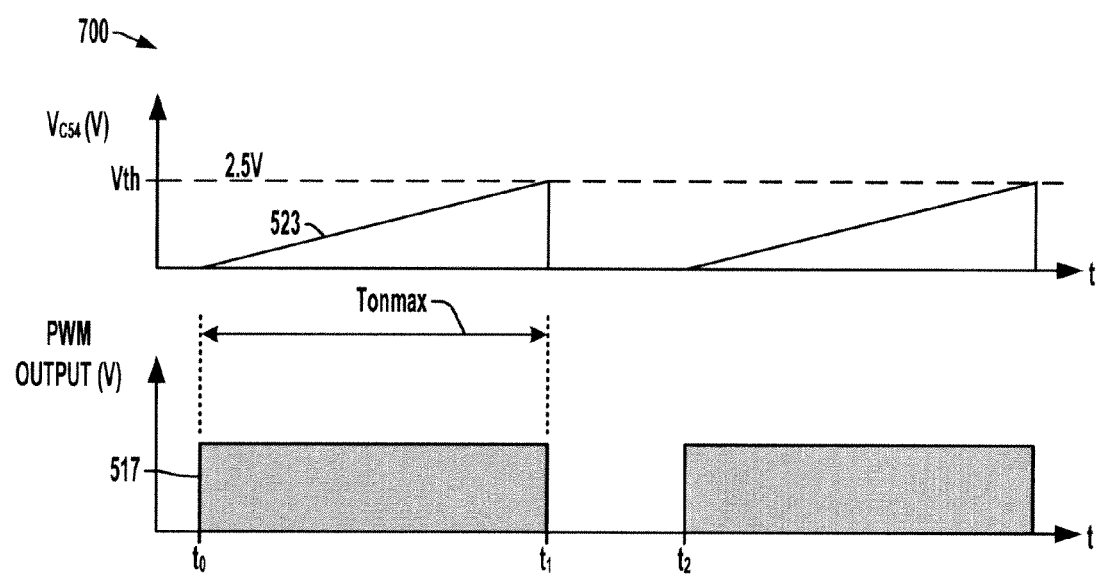
FIG. 4 is a graph illustrating operation of the on-time limiting circuit in the driver of FIG. 2.

Referring now to FIGS. 2-4, FIG. 2 illustrates portions of a power converter system with an exemplary universal power up circuit 600 and an exemplary driver 500 with a limiting circuit 520 to mitigate transformer saturation. The driver circuit 500 is connected to the above described buck-boost converter 300 to drive the gate G of a power conversion transistor Q1 by providing the gate-source voltage Vgs via a first driver output 541 operative to selectively provide a drive signal to the gate terminal G and a second driver output 542 coupled with the source terminal S of Q1.

The driver circuit 500 includes a driver transformer T51 with a primary winding P51 and a secondary winding S51 wound on a core TC51 (core and windings shown in FIG. 4). A PWM controller 510, such as an L6562 in certain embodiments, receives its power (Vcc) via a power connection 518 from the power up circuit 600. The driver circuit 500 provides a pulse width modulated gate drive signal at a PWM output 517 to a primary circuit including a first capacitor C51 coupled between a first end 531 of the primary winding P51 and the PWM output 517, with a second primary end 532 and a ground input 516 of the PWM controller 510 connected to a circuit ground. The PWM controller 510 generates the output 517 according to a control signal 112 received from a control circuit (not shown), and includes a control input 511 operative to selectively turn off or disable the PWM output 517.

The secondary winding S51 has a first end 533 and a second end 534 coupled with the second driver output 542. A second capacitor C52 is coupled between the first end 533 of the secondary winding S51 and the first driver output 541, with a first rectifier D51 and a capacitor C53 coupled between the first and second driver outputs 541 and 542.

The driver circuit 500 also includes a limiting circuit 520 with an input 521 coupled with the PWM output 517, and a limiting control output 522 coupled with the control input 511 of the PWM controller 510. In operation, the limiting control output 522 provides a limiting control signal to the control input 511 to limit the on-time of the PWM output 517 to be at or below an on-time threshold value Tonmax. This operation is shown in FIG. 4 in which the pulse width modulated driver output 517 stays active at most for Tonmax.

Figure 1A:
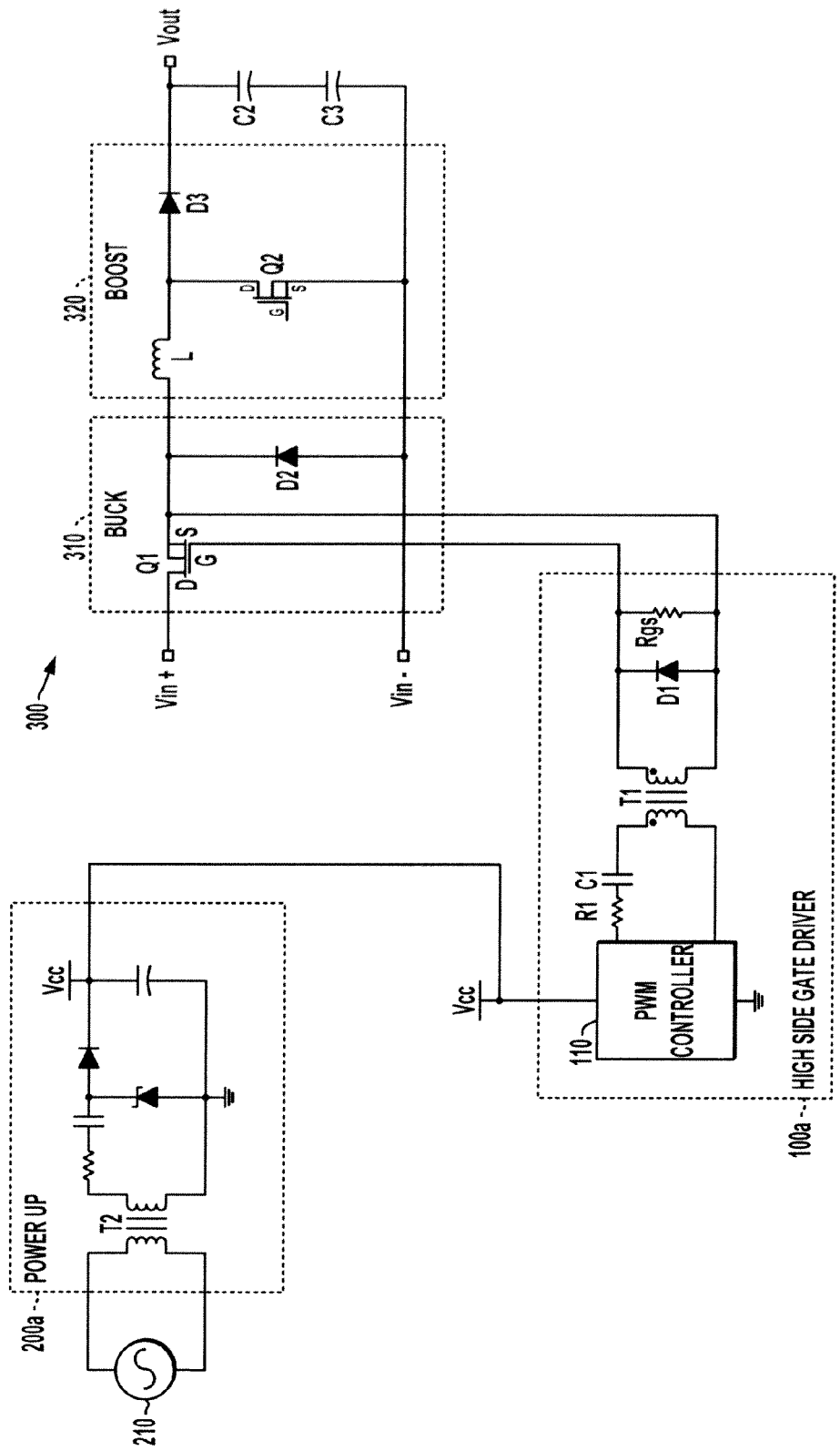
FIG. 1A is a schematic diagram illustrating portions of a conventional power conversion system with a charge-pump power up circuit and a high side gate driver circuit.
Figure 1B:
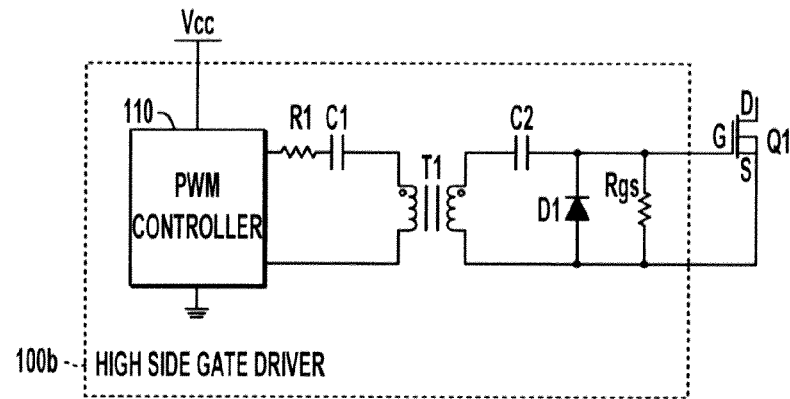
FIG. 1B is a partial schematic diagram illustrating another conventional driver circuit with an added secondary capacitor.
Figure 1C:
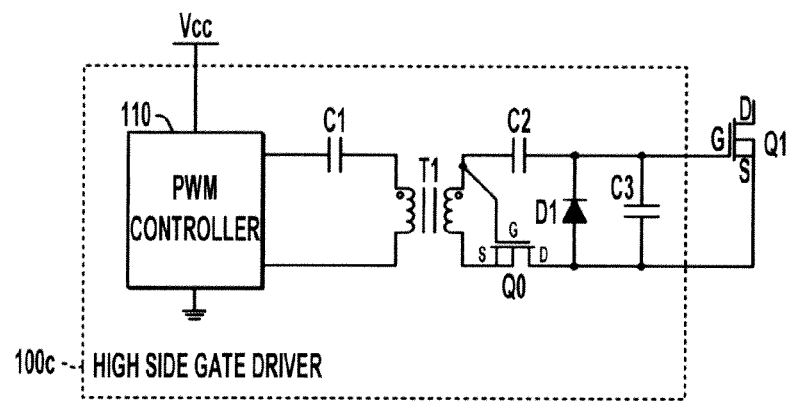
FIG. 1C is a partial schematic diagram illustrating a further conventional driver circuit with an added secondary circuit transistor to control transformer saturation.
Figure 1D:
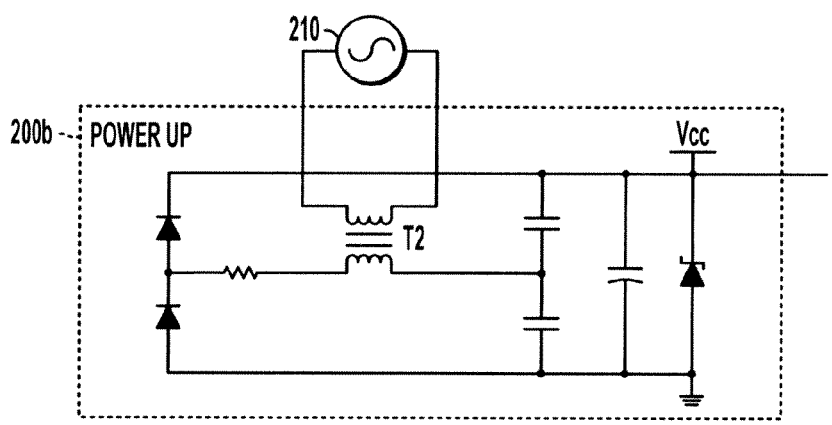
FIG. 1D is a partial schematic diagram illustrating conventional full wave rectifier power up circuit.

In certain embodiments, the on-time threshold value Tonmax is set to avoid saturation of the core TC51 of the driver transformer T51. The on-time limiting operation can be achieved by any suitable on-time limiting circuitry. In the example of FIG. 2, the limiting circuit input 521 includes a resistor R52 coupled between the limiting circuit input 521 and an intermediate node 523, as well as a capacitance C54 coupled between the intermediate node 523 and circuit ground and a diode D52 with an anode coupled with the intermediate node 523 and a cathode coupled with the limiting control output 522. In addition, the illustrated embodiment includes a second series circuit branch between the input 521 and the intermediate node 523, including a diode D53 and resistor R51. The resistor R52 and the capacitor C54 establish a time constant of the limiting circuit 520. This time constant determines the rise time of the voltage $V_{C54}$ across the capacitor C54 (e.g., the rise time of the intermediate node voltage. This rise time sets the time it takes for the voltage $V_{C54}$ at the intermediate node 523 to rise to a threshold voltage value Vth (e.g., 2.5 volts in one embodiment) as shown in FIG. 4. When this occurs, D52 turns on and activates the limiting circuit output 522 to cause the PWM output 517 to be deactivated. In this manner, the rise time of the voltage $V_{C54}$ of the intermediate node 523 of the limiting circuit 520 determines the on-time threshold value Tonmax (e.g., 30 us in one embodiment). The limiting circuit 520 thus operates to mitigate or prevent transformer saturation in the driver circuit 500 without requiring the addition of an extra MOSFET switch as was the case in the circuit of FIG. 1C above.

FIG. 2A shows another exemplary limiting circuit 320 similar in most respects to the above-describe limiting circuit in FIG. 2, except that the resistor R52 is connected to an intermediate node between the resistor R51 and the cathode of D53 instead of the input 521.

As also shown in FIG. 2, the power up circuit 600 provides power (Vcc) to the PWM controller 510, and provides a steady Vcc voltage level even in the presence of changing output loading conditions and for different AC input voltages. The power up circuit 600 includes an input 602 for receiving input power from an AC input source 210, where the input terminals are connected to a primary winding P of a power up circuit transformer T61. The transformer T61 has a first secondary winding S1 with a first end 611 coupled to a first power up circuit rectifier D61 as well as a second end 612 coupled to the circuit ground. In addition, the transformer T61 has another secondary S2 with a first end 621 coupled with the circuit ground and a second end 612 coupled to a second power up circuit rectifier D62. An output 630 is coupled with the first and second power up circuit rectifiers D61 and D62 and provides a generally constant output voltage Vcc to the power input 518 of the PWM controller 510 independent of a voltage of the AC input source 210. Any suitable dual rectifier circuit can be used to provide the universal input functionality.

In the illustrated example, the anode of rectifier D61 is coupled to the first end 611 of the first secondary winding S1, and the second rectifier D62 has an anode coupled to the second end 622 of S2 and a cathode coupled to the output 630. The circuit 600 further includes a resistance R61 coupled between the cathode of D61 and an intermediate node 631, and a first zener diode Z61 having an anode coupled to circuit ground and a cathode coupled to node 631.

A transistor Q64 has a source coupled to the output 630 and drain coupled to the first rectifier D61. The gate of Q4 is coupled to the intermediate node 631 with the gate-source voltage Vgs of Q4 setting the on/off state of the source-drain path of Q4. In this manner, the switching state of Q4 is used to selectively connect the first rectifier D61 with the output 630 when the output voltage Vcc at the output 630 is less than the zener voltage of Z61 (e.g., 15 volts in one example) and to selectively disconnect D61 from the output 630 when Vcc is greater than the zener voltage of Z61. This embodiment of the power up circuit 600 in FIG. 2 also includes an output capacitance Co coupled between the output 630 and the circuit ground, as well as a second zener diode Z62 with an anode coupled to the circuit ground and a cathode coupled to the output 630.

Figure 2B:
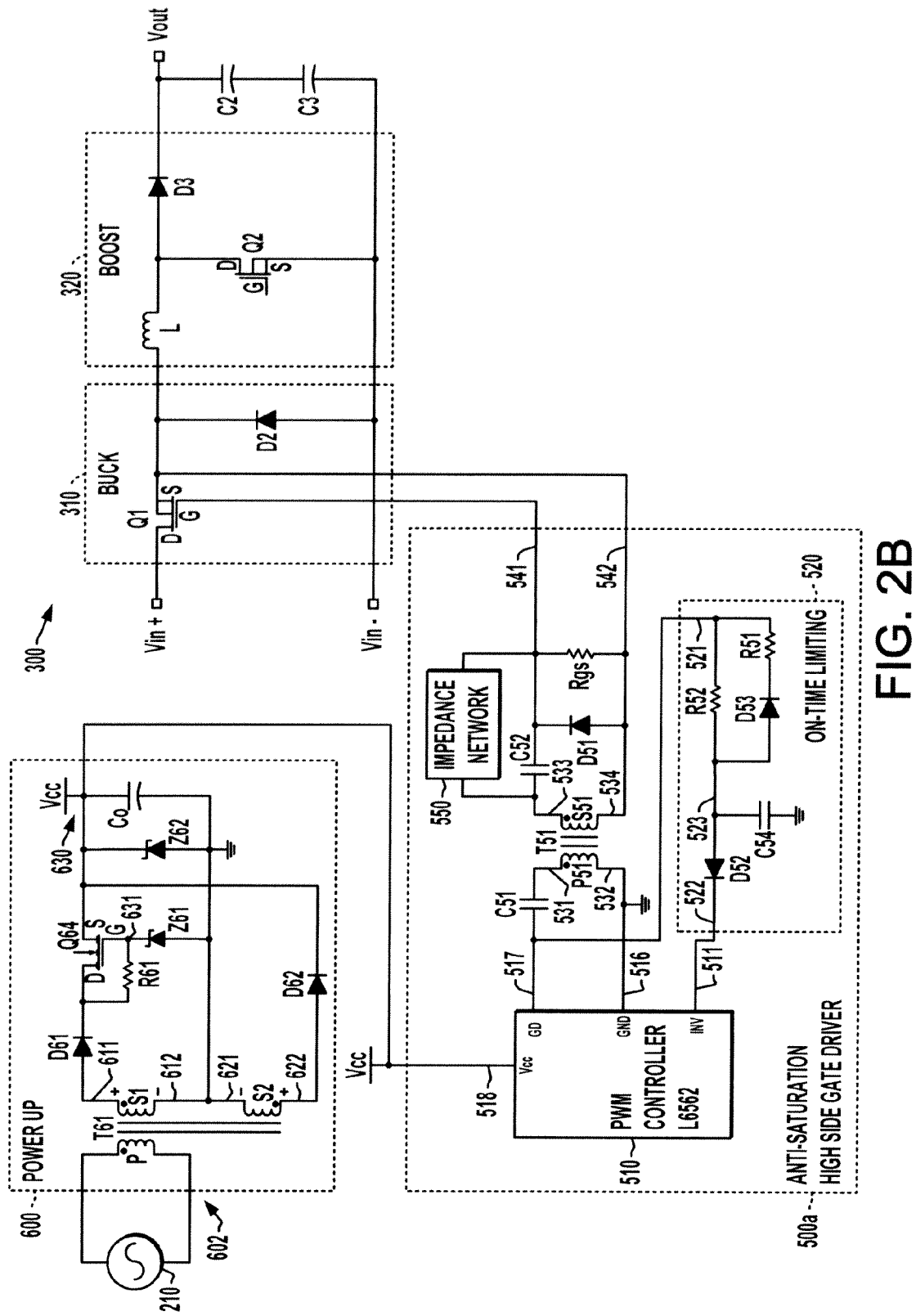
FIGS. 2B and 2C are schematic diagrams illustrating portions of a power converter with further exemplary drive controller circuits including a limiting circuit and an impedance network for discharging a secondary-side DC blocking capacitor.
Figure 2C:
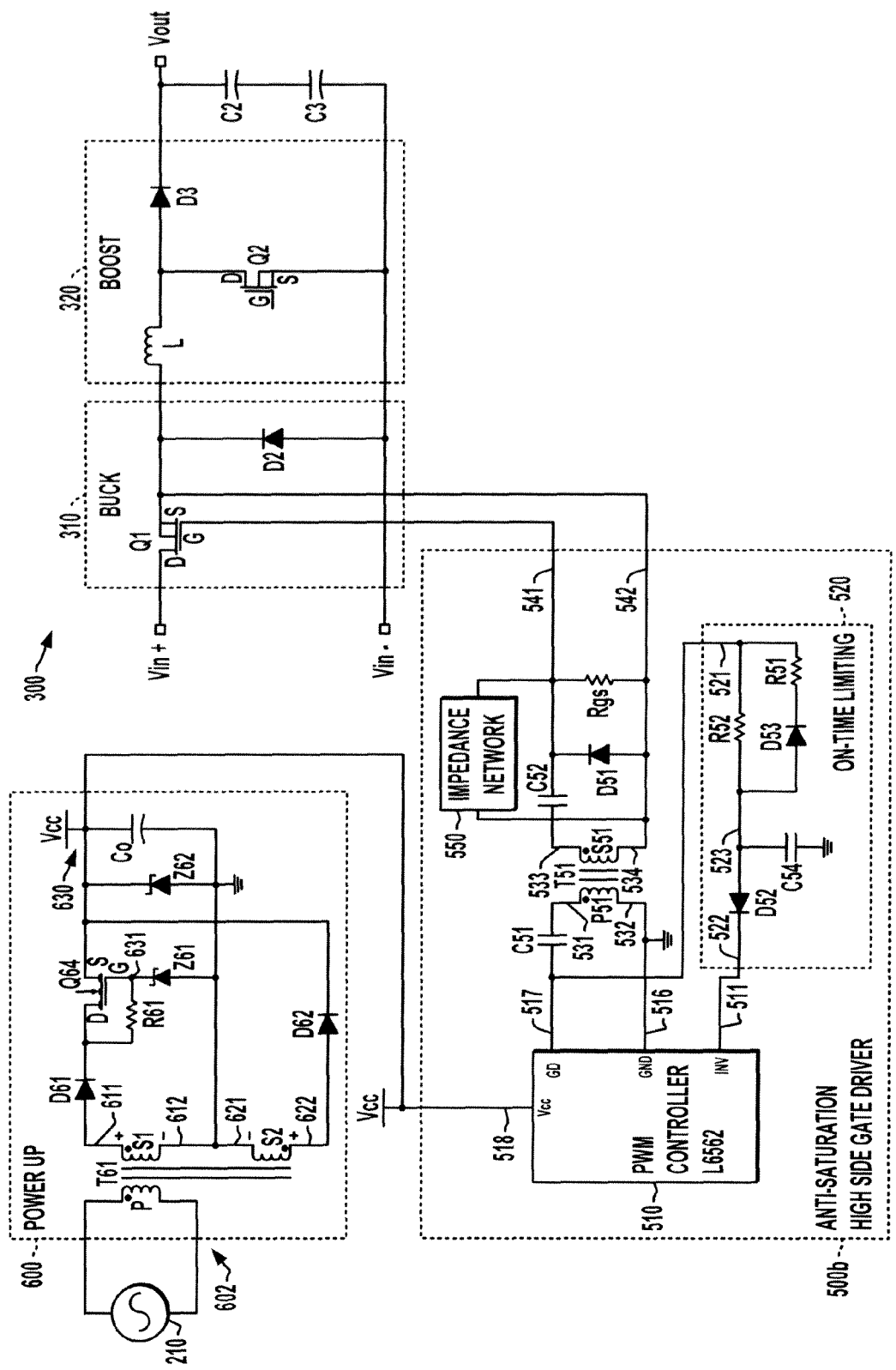

FIG. 2B shows another power converter embodiment with a drive controller circuit 500a having a limiting circuit and an impedance network 550 comprising one or more resistances, capacitances, inductances, and/or semiconductor-based impedances (variable or fixed) forming a DC blocking capacitor discharging circuit. In FIG. 2B, the impedance network 550 is coupled across the DC blocking capacitor C52 (between the driver output 541 and the first end 533 of the secondary winding S51 of transformer T51), along with a resistance Rgs across the driver outputs 541 and 542. FIG. 2C illustrates another example in which a drive controller circuit 500b includes such an impedance network 550 coupled between the driver outputs 541 and 542. As noted with respect to the circuit of FIG. 1B above, if the capacitance of the secondary-side DC blocking capacitor C52 in FIG. 2, 2B, or 2C is large and the transformer T51 is not saturated, the DC blocking capacitor C52 may discharge slowly when controller 510 shuts off, leading to the FET Q1 turning on. To address this DC blocking capacitor discharge problem, the impedance network 550 is used to accelerate the discharging time of C52 to avoid or mitigate inadvertent triggering of the transistor Q1 when the PWM controller IC 510 shuts off.

The above examples are merely illustrative of several possible embodiments of various aspects of the present disclosure, wherein equivalent alterations and/or modifications will occur to others skilled in the art upon reading and understanding this specification and the annexed drawings. In particular regard to the various functions performed by the above described components (assemblies, devices, systems, circuits, and the like), the terms (including a reference to a "means") used to describe such components are intended to correspond, unless otherwise indicated, to any component, such as hardware, software, or combinations thereof, which performs the specified function of the described component (i.e., that is functionally equivalent), even though not structurally equivalent to the disclosed structure which performs the function in the illustrated implementations of the disclosure. In addition, although a particular feature of the disclosure may have been illustrated and/or described with respect to only one of several implementations, such feature may be combined with one or more other features of the other implementations as may be desired and advantageous for any given or particular application. Furthermore, references to singular components or items are intended, unless otherwise specified, to encompass two or more such components or items. Also, to the extent that the terms "including", "includes", "having", "has", "with", or variants thereof are used in the detailed description and/or in the claims, such terms are intended to be inclusive in a manner similar to the term "comprising". The invention has been described with reference to the preferred embodiments. Modifications and alterations will occur to others upon reading and understanding the preceding detailed description. It is intended that the invention be construed as including all such modifications and alterations.

The following is claimed:

1. A driver circuit for driving a control terminal of a transistor, the driver circuit comprising:
    a first driver output operative to selectively provide a drive signal to a control terminal of a transistor;
    a second driver output coupleable to a second terminal of the transistor;
    a driver transformer comprising:
        a core,
        a primary winding wound on the core, and a secondary winding wound on the core having a first end and a second end coupled with the second driver output;

a pulse width modulation (PWM) controller comprising:
  a PWM output, and
  a control input;

a first capacitor coupled between a first end of the primary winding of the driver transformer and the PWM output;

a second capacitor coupled between the first end of the secondary winding of the driver transformer and the first driver output;

a first rectifier coupled between the first driver output and the second driver output; and a limiting circuit, comprising:
  a limiting circuit input coupled with the PWM output, and
  a limiting control output coupled with the PWM controller, the limiting control output providing a limiting control signal to the control input to limit an on-time of the PWM output to be at or below an on-time threshold value.

2. The driver circuit of claim 1, where the on-time threshold value is set to avoid saturation of the core of the driver transformer.

3. The driver circuit of claim 2, where the limiting circuit comprises:
  a resistor coupled between the limiting circuit input and an intermediate node;
  a limiting circuit capacitance coupled between the intermediate node and a circuit ground; and
  a limiting circuit diode comprising an anode coupled with the intermediate node and a cathode coupled with the limiting control output.

4. The driver circuit of claim 3:
  where the limiting circuit has a time constant set by the second resistor and the limiting circuit capacitance;
  where the time constant determines a rise time of a voltage of the intermediate node of the limiting circuit to rise to a threshold voltage value when the PWM output of the PWM controller is activated; and
  where the rise time of the voltage of the intermediate node of the limiting circuit determines the on-time threshold value.

5. The driver circuit of claim 1, where the limiting circuit comprises:
  a resistor coupled between the limiting circuit input and an intermediate node;
  a limiting circuit capacitance coupled between the intermediate node and a circuit ground; and
  a limiting circuit diode comprising an anode coupled with the intermediate node and a cathode coupled with the limiting control output.

6. The driver circuit of claim 5:
  where the limiting circuit has a time constant set by the resistor and the limiting circuit capacitance;
  where the time constant determines a rise time of a voltage of the intermediate node of the limiting circuit to rise to a threshold voltage value when the PWM output of the PWM controller is activated; and
  where the rise time of the voltage of the intermediate node of the limiting circuit determines the on-time threshold value.

7. The driver circuit of claim 6, further comprising a power up circuit providing power to the PWM controller, the power up circuit comprising:
  an input coupleable to an AC input source;
  a power up circuit transformer, comprising:
    a power up transformer primary winding coupled to the input to receive AC input power from the AC input source,
    a first power up transformer secondary winding with a first end coupled to a first power up circuit rectifier and a second end coupled to a circuit ground, and
    a second power up transformer secondary winding with a first end coupled with the circuit ground and a second end coupled to a second power up circuit rectifier; and
  an output coupled with the first and second power up circuit rectifiers and providing a generally constant output voltage to a power input of the PWM controller independent of a voltage of the AC input power.

8. The driver circuit of claim 7:
  where the first power up circuit rectifier comprises an anode coupled to the first end of the first power up transformer secondary winding and a cathode;
  where the second power up circuit rectifier comprises an anode coupled to the second end of the second power up transformer secondary winding and a cathode coupled to the output; and
  where the power up circuit further comprises:
    a power up circuit resistance coupled between the cathode of the first power up circuit rectifier and an intermediate power up circuit node, and
    a first zener diode comprising an anode coupled to the circuit ground and a cathode coupled to the intermediate power up circuit node, and
    a transistor comprising a first terminal coupled to the output, a second terminal coupled to the first power up circuit rectifier, and a control terminal coupled to the intermediate power up circuit node with a voltage between the control terminal and the first terminal determining an impedance between the first and second terminals of the transistor to selectively connect the first power up circuit rectifier with the output when the output voltage at the output is less than a zener voltage of the first zener diode and to disconnect the first power up circuit rectifier from the output when the output voltage at the output is greater than the zener voltage of the first zener diode.

9. The driver circuit of claim 5, further comprising a power up circuit providing power to the PWM controller, the power up circuit comprising:
  an input coupleable to an AC input source;
  a power up circuit transformer, comprising:
    a power up transformer primary winding coupled to the input to receive AC input power from the AC input source,
    a first power up transformer secondary winding with a first end coupled to a first power up circuit rectifier and a second end coupled to a circuit ground, and
    a second power up transformer secondary winding with a first end coupled with the circuit ground and a second end coupled to a second power up circuit rectifier; and
  an output coupled with the first and second power up circuit rectifiers and providing a generally constant output voltage to a power input of the PWM controller independent of a voltage of the AC input power.

10. The driver circuit of claim 9:
  where the first power up circuit rectifier comprises an anode coupled to the first end of the first power up transformer secondary winding and a cathode;

where the second power up circuit rectifier comprises an anode coupled to the second end of the second power up transformer secondary winding and a cathode coupled to the output; and where the power up circuit further comprises:
a power up circuit resistance coupled between the cathode of the first power up circuit rectifier and an intermediate power up circuit node, and
a first zener diode comprising an anode coupled to the circuit ground and a cathode coupled to the intermediate power up circuit node, and
a transistor comprising a first terminal coupled to the output, a second terminal coupled to the first power up circuit rectifier, and a control terminal coupled to the intermediate power up circuit node with a voltage between the control terminal and the first terminal determining an impedance between the first and second terminals of the transistor to selectively connect the first power up circuit rectifier with the output when the output voltage at the output is less than a zener voltage of the first zener diode and to disconnect the first power up circuit rectifier from the output when the output voltage at the output is greater than the zener voltage of the first zener diode.

11. The driver circuit of claim 1, further comprising a power up circuit providing power to the PWM controller, the power up circuit comprising:
an input coupleable to an AC input source;
a power up circuit transformer, comprising:
a power up transformer primary winding coupled to the input to receive AC input power from the AC input source,
a first power up transformer secondary winding with a first end coupled to a first power up circuit rectifier and a second end coupled to a circuit ground, and
a second power up transformer secondary winding with a first end coupled with the circuit ground and a second end coupled to a second power up circuit rectifier; and
an output coupled with the first and second power up circuit rectifiers and providing a generally constant output voltage to a power input of the PWM controller independent of a voltage of the AC input power.

12. The driver circuit of claim 11:
where the first power up circuit rectifier comprises an anode coupled to the first end of the first power up transformer secondary winding and a cathode;
where the second power up circuit rectifier comprises an anode coupled to the second end of the second power up transformer secondary winding and a cathode coupled to the output; and
where the power up circuit further comprises:
a power up circuit resistance coupled between the cathode of the first power up circuit rectifier and an intermediate power up circuit node, and
a first zener diode comprising an anode coupled to the circuit ground and a cathode coupled to the intermediate power up circuit node, and
a transistor comprising a first terminal coupled to the output, a second terminal coupled to the first power up circuit rectifier, and a control terminal coupled to the intermediate power up circuit node with a voltage between the control terminal and the first terminal determining an impedance between the first and second terminals of the transistor to selectively connect the first power up circuit rectifier with the output when the output voltage at the output is less than a zener voltage of the first zener diode and to disconnect the first power up circuit rectifier from the output when the output voltage at the output is greater than the zener voltage of the first zener diode.

13. The driver circuit of claim 12, where the power up circuit further comprises:
an output capacitance coupled between the output and the circuit ground; and
a second zener diode comprising an anode coupled to the circuit ground, and a cathode coupled to the output.

14. The driver circuit of claim 1, further comprising an impedance network coupled across the second capacitor between the first end of the secondary winding of the driver transformer and the first driver output.

15. The driver circuit of claim 1, further comprising an impedance network coupled between the first driver output and the second driver output.

16. The driver circuit of claim 1, wherein the second capacitor comprises:
a first terminal connected directly to the first end of the secondary winding of the driver transformer; and
a second terminal connected directly to the first driver output.

17. The driver circuit of claim 1, wherein the first rectifier comprises:
an anode connected directly to the second end of the secondary winding of the driver transformer; and
a cathode connected directly to the first driver output.

18. The driver circuit of claim 1, wherein the limiting circuit input is connected directly to the PWM output.

19. A universal input power up circuit for providing power to a gate drive controller circuit, the power up circuit comprising:
an input coupleable to an AC input source;
a power up circuit transformer, comprising:
a power up transformer primary winding coupled to the input to receive AC input power from the AC input source,
a first power up transformer secondary winding with a first end coupled to a first power up circuit rectifier and a second end coupled to a circuit ground, where the first power up circuit rectifier comprises an anode coupled to the first end of the first power up transformer secondary winding and a cathode, and
a second power up transformer secondary winding with a first end coupled with the circuit ground and a second end coupled to a second power up circuit rectifier, where the second power up circuit rectifier comprises an anode coupled to the second end of the second power up transformer secondary winding and a cathode coupled to the output, wherein the cathode of the first power up circuit rectifier is not directly connected to the cathode of the second power up circuit rectifier; and
an output coupled with the first and second power up circuit rectifiers and providing a generally constant output voltage to power a gate drive controller circuit independent of a voltage of the AC input power.

20. The power up circuit of claim 19, wherein the power up circuit further comprises:
a power up circuit resistance coupled between the cathode of the first power up circuit rectifier and an intermediate power up circuit node; and
a first zener diode comprising an anode coupled to the circuit ground and a cathode coupled to the intermediate power up circuit node; and
a transistor comprising a first terminal coupled to the output, a second terminal coupled to the first power up circuit rectifier, and a control terminal coupled to the intermediate power up circuit node with a voltage between the control terminal and the first terminal determining an impedance between the first and second terminals of the transistor to selectively connect the first power up circuit rectifier with the output when the output voltage at the output is less than a zener voltage of the first zener diode and to disconnect the first power up circuit rectifier from the output when the output voltage at the output is greater than the zener voltage of the first zener diode.

21. The power up circuit of claim 20, further comprising:
an output capacitance coupled between the output and the circuit ground; and
a second zener diode comprising an anode coupled to the circuit ground, and a cathode coupled to the output.

22. The power up circuit of claim 19, wherein the power up transformer primary winding comprises:
a first end connected directly to a first terminal of the input; and
a second end connected directly to a second terminal of the input.

23. A driver circuit for driving a control terminal of a transistor, the driver circuit comprising:
a first driver output operative to selectively provide a drive signal to a control terminal of a transistor;
a second driver output coupleable to a second terminal of the transistor;
a driver transformer comprising:
  a core,
  a primary winding wound on the core, and
  a secondary winding wound on the core having a first end and a second end coupled with the second driver output;
a pulse width modulation (PWM) controller comprising:
  a PWM output, and
  a control input;
a first capacitor coupled between a first end of the primary winding of the driver transformer and the PWM output;
a second capacitor coupled between the first end of the secondary winding of the driver transformer and the first driver output;
a first rectifier coupled between the first driver output and the second driver output; and
an impedance network coupled with the second capacitor to facilitate discharging of the second capacitor.

24. The driver circuit of claim 23, where the impedance network is coupled across the second capacitor between the first end of the secondary winding of the driver transformer and the first driver output.

25. The driver circuit of claim 23, where the impedance network is coupled between the first driver output and the second driver output.

* * * * *